United States Patent [19]
Wong

[11] Patent Number: 5,276,638
[45] Date of Patent: Jan. 4, 1994

[54] BIPOLAR MEMORY CELL WITH ISOLATED PNP LOAD

[75] Inventor: Robert C. Wong, Poughkeepsie, N.Y.

[73] Assignee: International Business Machines Corporation, Armonk, N.Y.

[21] Appl. No.: 738,420

[22] Filed: Jul. 31, 1991

[51] Int. Cl.$^5$ .................. G11C 11/00; G11C 11/34; H01L 29/00; H01L 27/082

[52] U.S. Cl. .................. 365/156; 365/154; 365/155; 365/174; 365/179; 257/557; 257/511; 257/574; 257/575

[58] Field of Search ............ 365/154, 155, 156, 174, 365/177, 179; 257/557, 511, 574, 575

[56] References Cited

U.S. PATENT DOCUMENTS

| | | | |
|---|---|---|---|
| 3,423,737 | 1/1969 | Harper | 340/173 |
| 3,643,235 | 2/1972 | Berger et al. | 340/173 FF |
| 3,815,106 | 6/1974 | Wiedmann | 340/173 FF |
| 3,863,229 | 1/1975 | Gersbach | 340/173 FF |
| 3,909,807 | 9/1975 | Fulton | 340/173 FF |
| 3,986,178 | 10/1976 | McElroy et al. | 340/173 R |
| 4,122,542 | 10/1978 | Camerik et al. | 365/156 |
| 4,144,586 | 3/1979 | U | 365/156 |
| 4,158,237 | 6/1979 | Wiedmann | 365/154 |
| 4,193,126 | 3/1980 | Smith | 365/174 |
| 4,346,458 | 8/1982 | Berger et al. | 365/174 |
| 4,366,554 | 12/1982 | Aoki et al. | 365/155 |
| 4,375,645 | 3/1983 | Funatsu | 365/50 |
| 4,387,445 | 6/1983 | Denis et al. | 365/179 |
| 4,400,712 | 8/1983 | O'Connor | 357/44 |
| 4,404,662 | 9/1983 | Masenas, Jr. | 365/154 |
| 4,460,984 | 7/1984 | Knepper | 365/154 |
| 4,535,425 | 8/1985 | Wiedmann | 365/156 |
| 4,543,595 | 9/1985 | Vora | 365/154 |
| 4,580,244 | 4/1986 | Lake | 365/154 |
| 4,813,017 | 3/1989 | Wong | 365/156 |

FOREIGN PATENT DOCUMENTS

| | | | |
|---|---|---|---|
| 0185545 | 12/1985 | European Pat. Off. | 365/156 |
| 0324580 | 1/1989 | European Pat. Off. | 365/156 |
| 61-9897 | 1/1986 | Japan | 365/154 |
| 744724 | 7/1980 | U.S.S.R. | 365/154 |

OTHER PUBLICATIONS

IBM Technical Disclosure Bulletin, vol. 26, No. 9, Feb. 1984, pp. 4720–4721 "Saturated CTS Memory Cell Using a PNP Load".

Conference, 1978, Internat. Electron Devices, pp. 213–216, "A New I$^2$L Memory Cell–Double Diffused Base Structure".

*Primary Examiner*—Rolf Hille
*Assistant Examiner*—Steven Loke
*Attorney, Agent, or Firm*—Charles W. Peterson, Jr.

[57] ABSTRACT

A bipolar memory array and memory cell. The memory cell has a pair of cross coupled NPN storage transistors and a pair of PNP load transistors. The collector of each of the load transistors is connected to one of the storage transistors. A base, common to both load transistors, are connected to a drain line. The word line is connected to an emitter common to both of the load transistors. The cell is connected to a bit line pair through Schottky Barrier Diodes (SBD's) or, alternatively, through emitters of transistors which share a common base and a common collector with the cross coupled storage transistors.

25 Claims, 6 Drawing Sheets

BIPOLAR MEMORY CELL WITH ISOLATED PNP LOAD

DESCRIPTION

BACKGROUND OF THE INVENTION

This invention relates to high density, high performance, semiconductor arrays of memory, and in particular to complementary bipolar transistor memory cells.

It is well known in the art that although a bipolar transistor's emitter and collector terminals may be swapped, the emitter and collector terminals are not functionally equivalent. A transistor with its base to emitter junction forward biased and base to collector junction reversed biased exhibits a high current amplification. The same transistor with its emitter and collector swapped, i.e., its base to collector junction forward biased and its base to emitter junction reverse biased, exhibits much lower current amplification. The first biasing condition is the transistor's normal mode of operation and the second biasing condition is the transistor's inverse mode of operation. Transistors operating in their inverse mode are known as inverse mode or inversion mode transistors.

In Merged Transistor Logic (MTL) memory cell design inverse mode transistors were used in the prior art. Inverse mode transistors were used because, the cell's cross coupled transistors could be made much smaller as inverse mode transistors than as normal mode transistors. Vertical transistors have small emitters on and surrounded by a base region and the base region is on and surrounded by a much larger collector region. Because isolating transistor collectors means significantly expanding transistor area, inversion mode transistors were used for cross coupled transistors with a common emitter connection. Although these cross-coupled transistors were schematically represented as normal mode transistors, it was understood and described in the prior art that the cross coupled transistors in merged transistor memory cells were inversion mode transistors. Efficient use of space is especially important in memory cell design because chip size is directly proportional to cell size. A 10% reduction in cell size will translate to nearly a 10% reduction in chip size. A 10% reduction in chip size translates to 11% increase in the number of chips per wafer and, because wafer cost is generally independent of number of chips on the wafer, memory chip cost is reduced. However, reducing size by using inverse mode transistors meant that, because inversion mode transistors are slow, these merged transistor memory cells were slow.

A high performance alternative to the merged transistor cell was the complementary transistor switch (CTS) cell of U.S. Pat. No. 3,863,229 incorporated herein by reference. Essentially, the CTS cell was a pair of cross coupled PNPN switching devices (silicon controlled rectifier or SCR). Each SCR has a Schottky Barrier Diode (SBD) across the second PN junction (between the SCR's control gates). The SBD prevents saturation of the NPN and PNP transistors which are intrinsic to the SCR structure. That the current limiting SBD's could be eliminated was disclosed in "saturated CTS Memory Cell Using A PNP Load", IBM Technical Disclosure Bulletin Vol. 26 No. 9, Feb. 1984, pp 4720-21.

While the CTS cell improved read access performance over the merged transistor cell without sacrificing cell density, the CTS cell still suffered from a slow cell write time. Cell write time was slow for 2 reasons. First, when a SCR is turned on, both intrinsic transistors are in deep saturation. As a result, the junction capacitances are high. Second, writing the cell is done by pulling one side of the cell high, i.e., by supplying enough current to the collector of the intrinsic NPN transistor in the "ON" SCR to pull that NPN transistor far enough out of saturation to switch the "OFF" SCR on. Even after the "OFF" SCR has been switched on, the CTS cell still has not been written The "OFF" SCR must have been switched on long enough to turn the "ON" SCR off. Switching time required to switch the CTS cell is further impaired because the junction capacitance of the "ON" SCR (which is in deep saturation) is high. High junction capacitance means stored charge is high Since discharge time for any given discharge current is directly related to the amount of stored charge, increased stored charge means increased discharge (write) time. So, because writing the CTS memory cell requires the time it takes to pull one side of the cell high, thereby turning on the "OFF" SCR, and pull the other side low, thereby turning off the "ON" SCR, the CTS write time is slow.

A second problem encountered with the CTS cell which arose from an attempt to improve CTS write time was intolerance to leakage from the intrinsic PNP transistors. In order to improve write time, the current gain of the SCR's intrinsic PNP and NPN transistors was weakened. Weakening the intrinsic transistors made the cell easier to write because the ON SCR's weakened transistors were not as deeply in saturation. So, weakening the transistors produced the same effect as the SBD's in early CTS cells. However, a cell which is easier to write is often easier to upset or disturb and is, therefore, less stable. Leakage problems occurred because of leakage between the high side of cell and the substrate. As a result of weakening the SCRs, the SCR's functions became leakier. While leakage in the PN junction between the P type substrate and the base of the PNP transistor in the "ON" SCR merely reinforced the low level on the base of "ON" SCR's intrinsic PNP transistor, leakages in the PN junction between the P type substrate and the base of the PNP transistor in the "OFF" SCR had the opposite effect The leakage in the intrinsic PNP transistor base of the "OFF" transistor pulled the cell's high side down, reducing the levels stored in the cell, making the cell easier to upset or disturb, and therefore, even less stable Consequently the CTS cell was more sensitive to read disturb, soft errors and other noise.

Read disturbs occur when, in an attempt to read the data stored in the cell, the cell is upset. Soft errors are errors induced into a memory chip when a memory cell is upset by its environment, such as by being upset when PN junction in the cell is struck by an alpha particle. Memory cell designers were thus faced, with trading performance for density and stability; stability for performance and density; or, density for performance and stability.

OBJECT OF THE INVENTION

It is an object of the invention to shorten high performance memory cell write time.

It is another object of the invention to shorten high performance memory cell write time without sacrificing cell density.

It is still another object of this invention to improve high performance memory cell stability.

It is still another object of the invention to improve high performance memory cell tolerance to cell transistor leakage.

It is still another object of the invention to improve high performance memory cell noise tolerance.

It is still another object of the invention to improve high performance memory soft error rate.

It is still another object of the invention to shorten high performance memory cell write time, improve cell stability, improve cell tolerance to transistor leakage, improve cell noise margin, and improve soft error rate, without sacrificing cell density.

SUMMARY OF THE INVENTION

In accordance with the objects of this invention, a high performance, stable memory cell with an improved write time, transistor leakage tolerance, noise tolerance, and soft error rate is provided which is comparable in size to prior art CTS cells.

The memory cell of the present invention includes a pair of cross-coupled normal-mode NPN transistors and a pair of PNP load transistors. The collector of each PNP load transistor is connected to the collector of one of the cross coupled NPN transistors. The PNP load transistors share a common emitter which is connected to a word line. A drain line is connected to the emitters of the NPN transistors and the base of the PNP transistors. Connection to a pair of bit lines from the cross coupled storage nodes can be through Schottky diodes. Alternatively, connection to bit lines can be through the emitter of NPN transistors which share their bases and collectors with the cross coupled NPN transistors in the cell.

BRIEF DESCRIPTION OF THE DRAWINGS

While the specification concludes with claims particularly pointing out and distinctly claiming that which is regarded as the present invention, details of the preferred embodiments of the invention may be more readily ascertained from the following technical description which read in conjunction with the following drawings wherein.

TECHNICAL DESCRIPTION OF THE PREFERRED EMBODIMENTS

Figure 1:
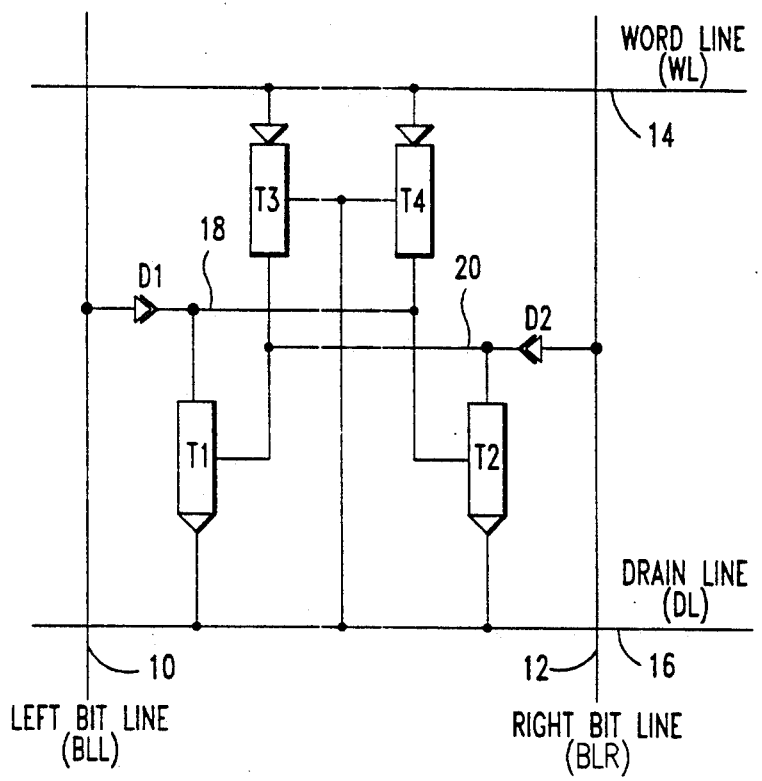
FIG. 1 is a schematic diagram of a Saturated Memory Cell with Isolated PNP load (SCIP).
Figure 2:
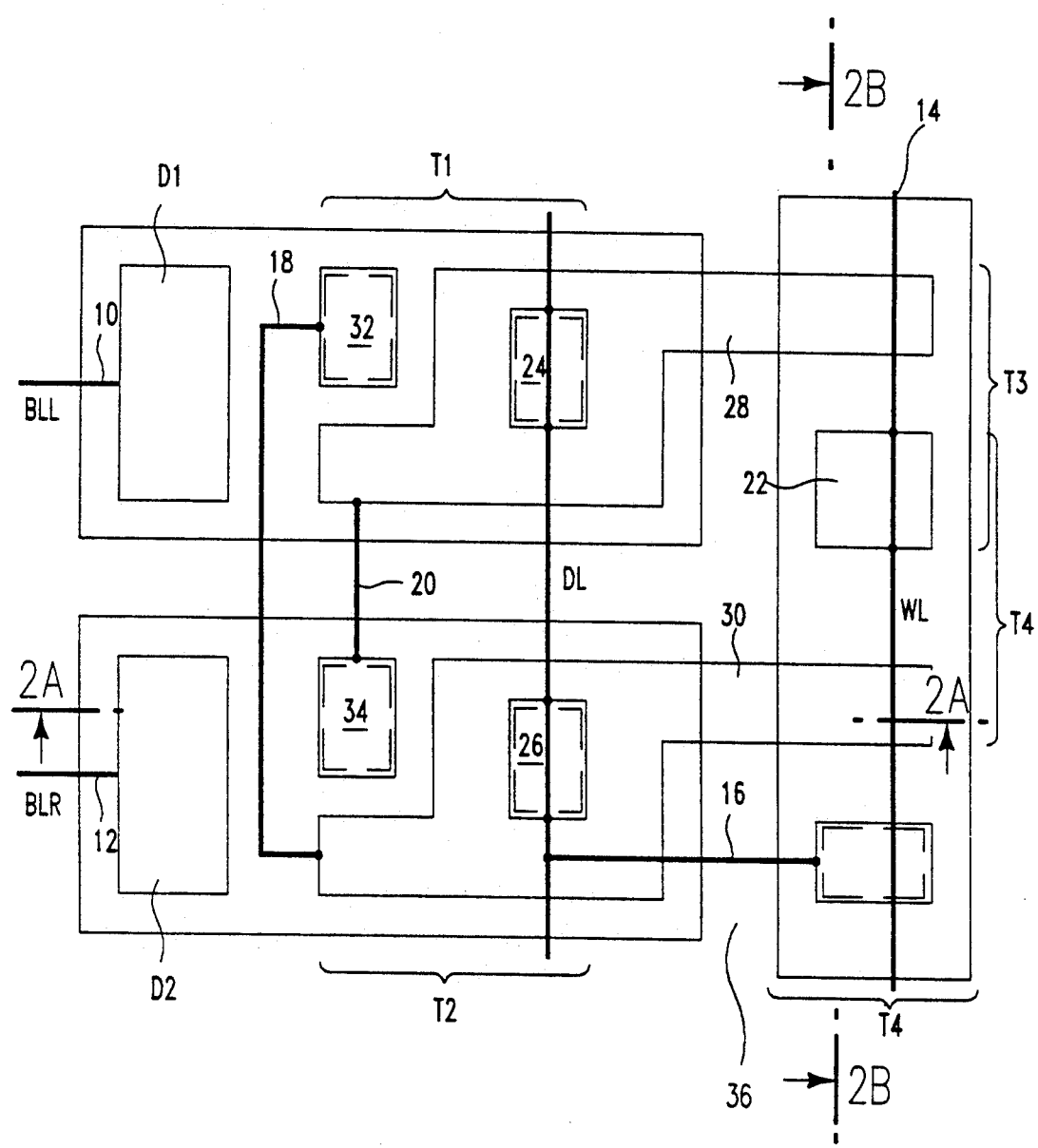
FIG. 2 is a plan view of a layout of the physical structure of the SCIP cell of the present invention.
Figure 2A:
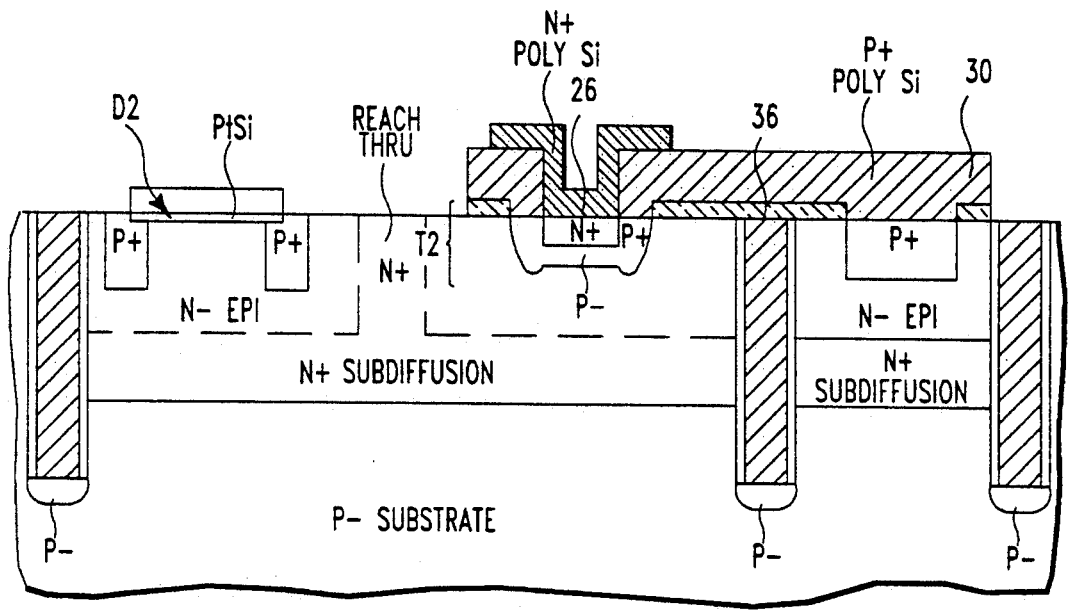
FIG. 2A is a representation of a physical cross section of the memory cell of FIG. 2 taken at 2A—2A.
Figure 2B:
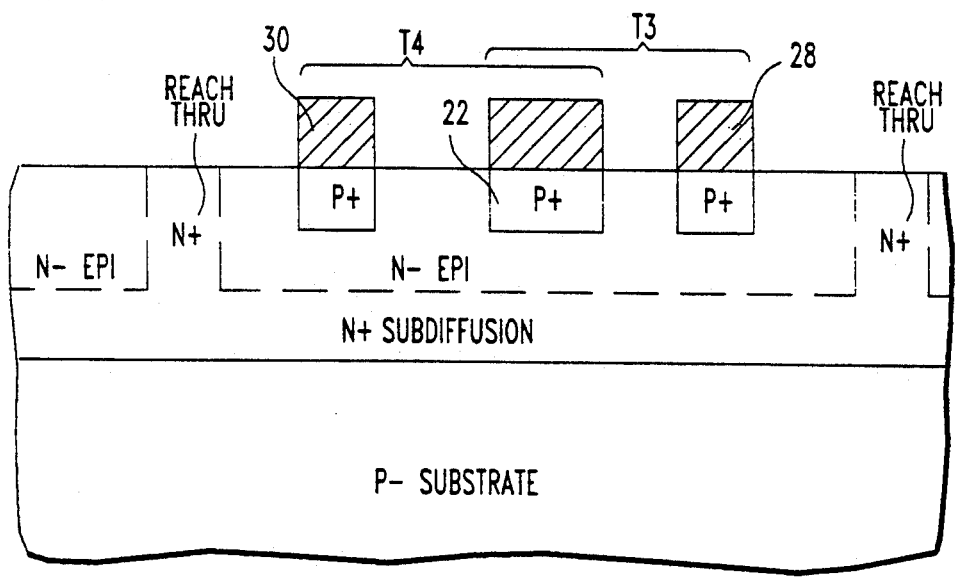
FIG. 2B is a representation of a physical cross section of cell of FIG. 2 taken at 2B—2B.

FIG. 1 is a schematic diagram of a first embodiment of the memory cell of the present invention, a Saturated Memory Cell with Isolated PNP load (SCIP). FIG. 2 is a plan view of the physical structure (layout) of the SCIP memory cell of FIG. 1 with representative wiring. FIG. 2A is a representation of a physical cross section of the memory cell of FIG. 2 through 2A—2A. FIG. 2B is a representation of a physical cross section of the memory cell of FIG. 2 through 2B—2B.

Two cross coupled NPN transistors, (T1 and T2) store 1 bit of data on internal storage nodes 18 and 20. Two PNP load transistors, T3 and T4, supply current to the cross coupled transistors to prevent data loss. SBD's D1 and D2 connect a left bit line, 10, and a right bit line 12 to internal nodes 18 and 20 respectively. Both bit lines 10 and 12 are metal. A metal word line 14 is connected to a single emitter 22 which is common to, and is the emitter for both T3 and T4. A metal drain line, 16, is connected to the base of T3 and T4 and to the emitter 24 and 26 of each NPN transistor T1 and T2. In the preferred embodiment SCIP cell, the base of T1 and the collector of T3 are connected together and formed by a single piece of polysilicon 28, and the base of T2 and the collector of T4 are connected together and formed by a single piece of polysilicon 30. The cross couple connection is made by metal straps at nodes 18 and 20 wired from each of the polysilicon NPN transistor bases 28 and 30 to each of the opposing NPN transistor collectors 32 and 34 respectively. Trench isolation 36 isolates the collector of the PNP load transistors from the collectors of the NPN transistors and each NPN transistor from other NPN transistors. Thus there are no PNPN structures and no inversion mode NPN transistors in the memory cell of the present invention.

Figure 3:
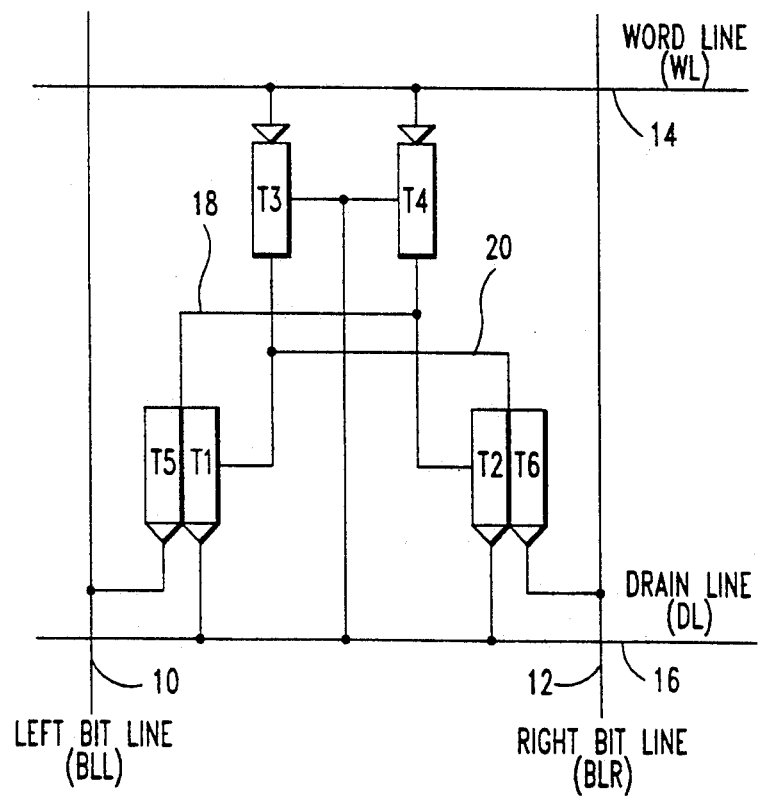
FIG. 3 is a schematic diagram of an Emitter Coupled Memory cell with Isolated PNP load (ECIP).
Figure 4:
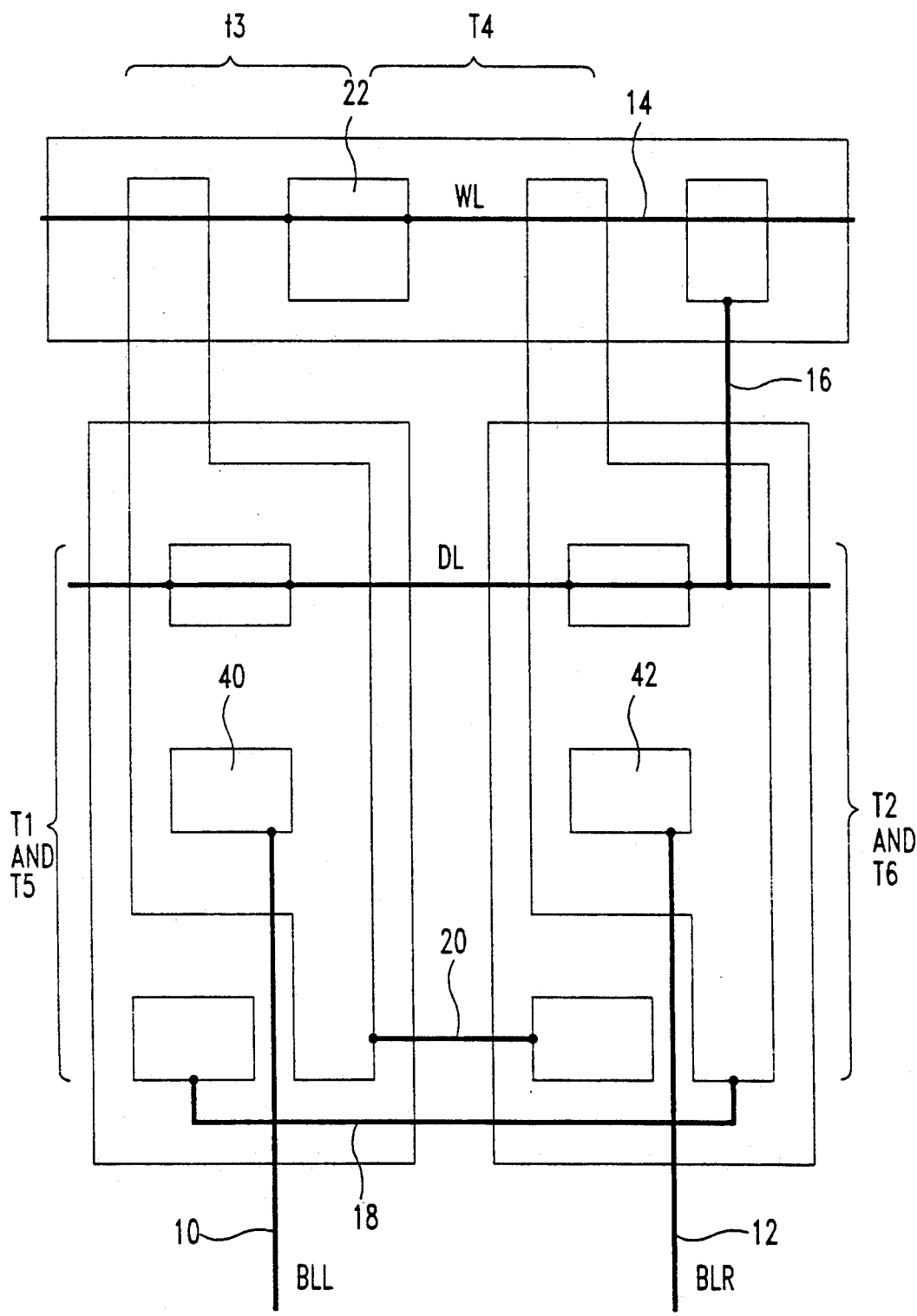
FIG. 4 is a plan view of the physical structure of the ECIP cell of the present invention.

FIG. 3 is a schematic diagram of a second preferred embodiment of the memory cell of the present invention, an Emitter Coupled memory cell with Isolated PNP load (ECIP). FIG. 4 is a layout of the ECIP cell of FIG. 3. The ECIP memory cell of this second embodiment is identical to the SCIP cell of FIG. 1 except that SBD's D1 and D2 have been replaced by NPN transistors T5 and T6. The emitters of T5 and T6, 40 and 42, are connected to left bit line 10 and right bit line 12 respectively. T5 shares its base and collector with T1 and T6 shares its base and collector with T2. Polysilicon transistor bases 28 and 30 were lengthened to accommodate placement of emitters 40 and 42 and, D1 and D2 were eliminated. In other respects the ECIP layout in FIG. 4 is identical to the layout in SCIP FIG. 2. So, the description set forth for the layout in FIG. 2 applies to the common element of FIG. 4 except as noted above.

Figure 5:
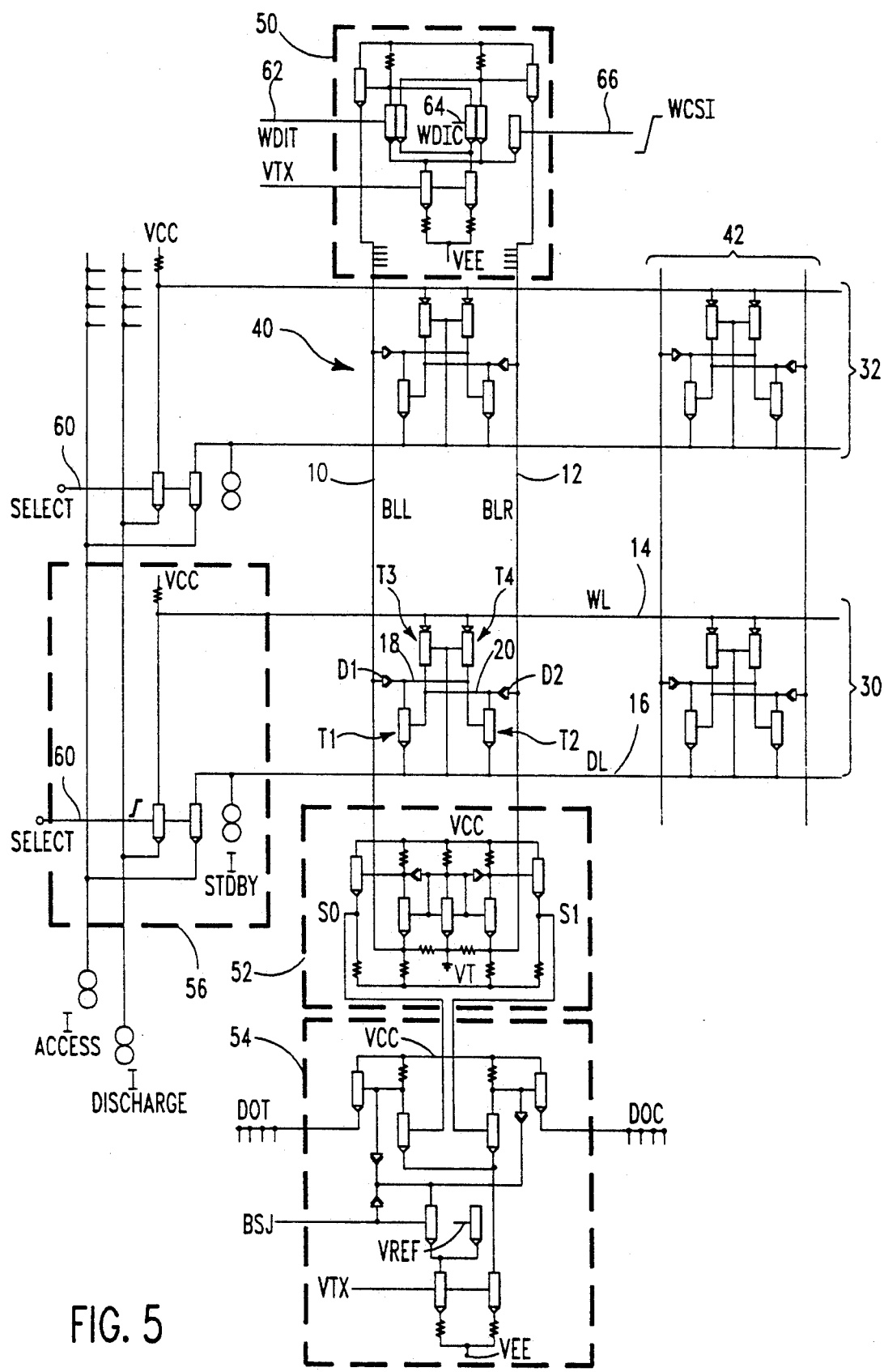
FIG. 5 is a schematic diagram of a cross section of a SCIP memory array.

FIG. 5 is a schematic diagram cross section of a SCIP memory array. The SCIP memory cell array is organized in rows 30 and 32 and columns 40 and 42. Although only 2 rows and 2 columns are represented here, normally the number of rows and columns is much higher. Each column has a column write circuit 50, a sense amplifier 52, and a sense driver 54. Each row has a word line driver 56, which when selected 60, drives the Word Line (WL) 14 and Drain Line (DL)16 for a row of cells.

Data is written into a single cell as follows. Data is placed on WDIT, 62, its complement is placed on WDIC 64. When WCSI 66 is driven above the level of both WDIT and WDIC, the column write circuit 50 will clamp either BLL 10 or BLR 12 high depending on whether WDIT or WDIC is high. A high on WDIT and low on WDIC produces a low on BLL 10 and a high on BLR 12 and, vice versa. When select 60 rises, selecting a word line drive 56, both WL 14 and DL 16 fall selecting a word line. When DL falls sufficiently to forward bias both the SBD connected to the bit line that is clamped high and the base-emitter junction of the NPN transistor connected to that SBD, then the cell switches.

Reading a memory cell in the SCIP memory array of FIG. 5 is done by selecting a word line driver 56, holding column write circuits 50 disabled (WCSI 66 remain low), and selecting a sense driver 54. When the word line is selected as described above, either BLL 10 or BLR 12 in each column is pulled low through an SBD, D1 or D2, respectively, in one cell in each column. When the selected DL 16 is pulled low enough to turn on SBD, D1 or D2, the on NPN transistor in the cell will pull BLL 10 or BLR 12 below the standby voltage set by sense amplifier 52. Sense amplifier 52 amplifies the bit line imbalance caused by one bit line side (BLL 10 on BLR 12) being pulled low and, transfers the data from BLL and BLR to S0 and S1. A high or low on BLL 10 is amplified to S0 and a high or low on BLR 12 is amplified to S1. BJS is normally high and pulled low to select a sense driver 54. When the sense driver 54 is selected by a low on BJS, S0 and S1 are passed on DOC and DOT. With the sense driver selected, S1 high and S0 low produces a high on DOT and a low on DOC and, vice versa. $V_{tx}$ and $V_{ref}$ are both reference voltages which set desired operating conditions for the column write circuit 50 and the sense driver 54.

Figure 6:
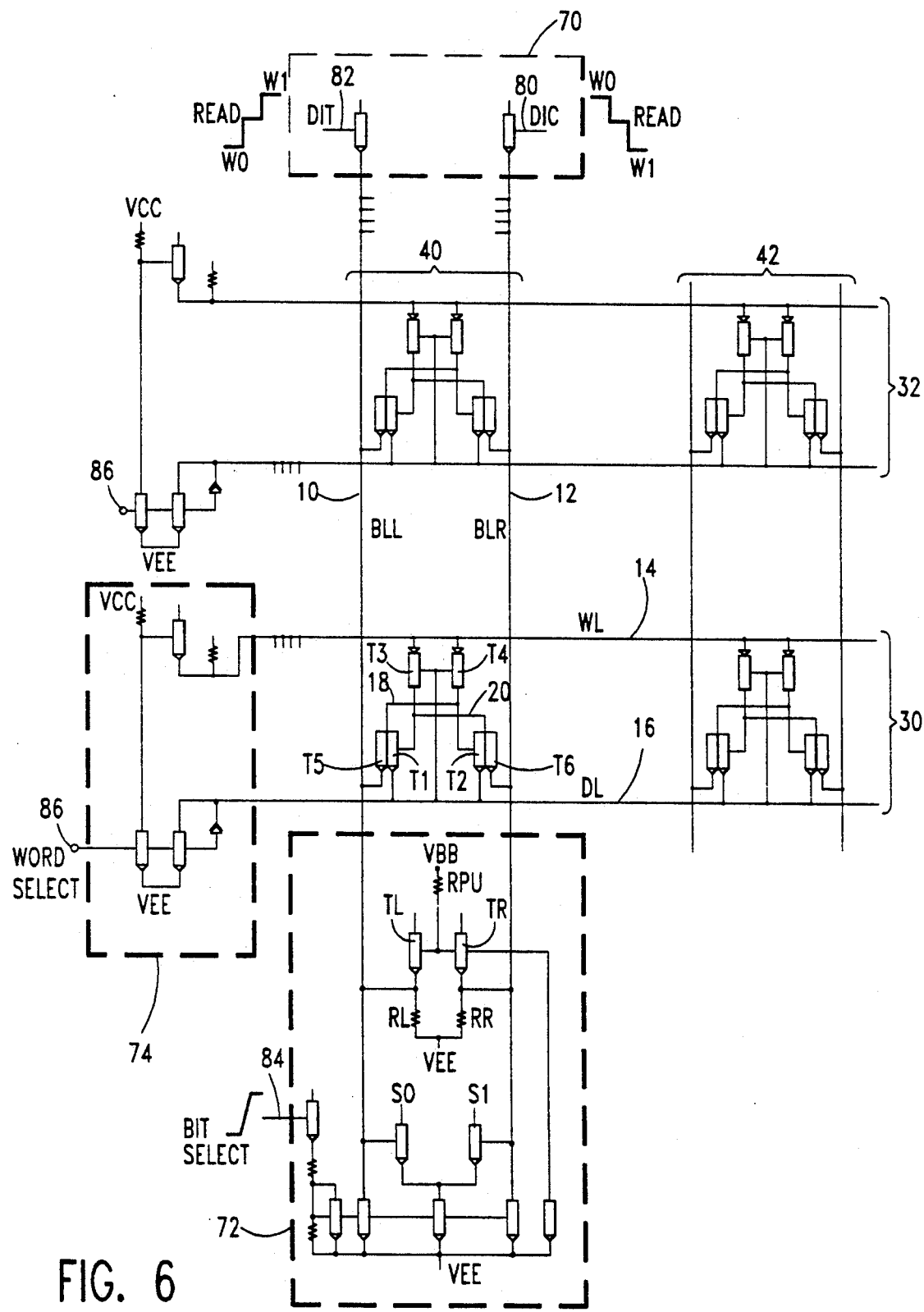
FIG. 6 is a schematic diagram of a cross section of an ECIP memory array.

FIG. 6 is a schematic diagram of a cross section of an ECIP memory array. The ECIP memory cell array is organized in rows 30 and 32 and columns 40 and 42. Each column has a column write circuit 70 and a column select/read circuit 72. Each row has a Word Line driver circuit 74 for driving the Word Line (WL) 14 and Drain Line (DL) 16 for a row of cells. Writing this ECIP cell (see FIG. 3) differs from writing the SCIP memory cell. The ECIP memory cell is written by pulling BLL (or BLR) low enough to turn on T5 (or T6), pulling cross-coupled node 18 (or 20) low, and thus switching the cell. Because the ECIP cell is written differently than the SCIP cell, the memory array cross section of FIG. 6 is substantially different from that of FIG. 5. DIT 80 and DIC 82 have three possible input levels, high (write a "1"), low (write a "0"), and read level approximately mid-way between the high and low levels. Either DIC 80 is the complement of DIT 82, or both DIC & DIT are at the read level (in the read state).

The ECIP cell is written by driving either DIC or DIT high, clamping either BLR 12 or BLL 10 high respectively. Bit Select 84 is then driven high for the selected column. A high at Bit Select 84 on a column select/read circuit 72 turns TL and TR off and resistor RL or RR pulls low whichever of BLL 10 or BLR 12 is not clamped high by column write circuit 70. Word Select 86 falls selecting a Word Line driver 74. The word line driver circuit 74 drives WL 14 high and allows DL 16 to be pulled high by the cells on the word line. As DL 16 rises, 18 and 20 are rising with it in every cell on the selected word line 30. In the selected cell, the emitter of T5 (or T6) is pulled low while the emitter of T6 (or T5) is clamped high. Then T5 (or T6) pulls 18 (or 20) low, while T2 (or T1) holds 20 (or 18) low. When 18 (or 20) is pulled low enough to turn T2 (or T1) off, then T3 (or T4) pulls 20 (or 18) up, switching the state of the cell and the cell has been written. Cells on the selected word line 30 but not on the selected column each have both BLL 10 and BLR 12 pulled high by TL and TR (which are biased on by RPU) and so, remain unwritten.

Reading a cell in the ECIP memory array of FIG. 6 is similar to writing the cell except, as noted above, DIT 82 and DIC 80 are held at an intermediate voltage level. When Word Select 86 falls, WL 14 and DL 16 rise as in the write. Bit Select 84 rises pulling BLL 10 and BLR 12 lower in the selected column 40 than in the unselected columns 41. When DL rises 18 and 20 also rise until transistor T5 (or T6) turns on pulling BLL (or BLR) slightly higher creating an inbalance in BLL 10 and BLR 12. Effectively, at this point, data which was stored on T1 and T2 in the cell has been transferred to T5 and T6. Column Select/Read Circuit 72 senses the imbalance in BLL 10 and BLR 12 which 72 amplifies by placing a current difference in S0 and S1. If BLL 10 is higher than BLR 12, the current into S0 will be higher than the current into S1 and vice versa.

In both the SCIP and the ECIP memory cells, cell write performance is improved over prior art cells because the voltage on WL, 14 can be dropped low enough to reduce the drive on both T3 and T4 while data remains latched on T1 and T2. Instead of being in deep saturation during a write, as the prior art "ON" SCR was, the "ON" transistor in the cell of the present invention is lightly saturated. Since the transistors are lightly saturated, less charge is stored and, therefore, cell write time is improved. Furthermore, the "ON" transistor is turned off, almost coincident with turning on the "OFF" transistor. Additionally, the cell of the present invention has improved write performance over the MTL cell because the normal mode transistors used in the ECIP and SCIP cell switch faster than corresponding inverse mode transistors used in MTL cells. Thus, cell write performance in the present invention is greatly improved over the prior art CTS and MTL cells.

Since the cell of the present invention does not use cross coupled SCR's as does the CTS cell, the importance of the problems encountered with the CTS cell is much diminished with the cell of the present invention. There is no longer a need to weaken the PNP transistors because the current supplied by the PNP transistors during a write is easily controlled by design. Furthermore, since the PNP transistors in the cell of the present invention are load transistors, instead of intrinsic to SCR's, PNP leakage does not affect the cell. PNP base to substrate leakage is reduced because PNP base to substrate voltage is minimized. The load transistors share a common base, so base to substrate leakage is common to both transistors and thus not more severe for one PNP transistor than for the other as was the case with the prior art cells. Since the PNP load transistors' bases are connected to Drain Line 16, base to substrate leakage current is not supplied by discharging the cell as in the prior art CTS cell, but is, instead, supplied by the cell's ON NPN transistor T1 or T2 and, therefore, does not pull the cell's high side down. Therefore, noise sensitivity and soft error rate are also much reduced by design.

While what is considered to be the preferred embodiments of my invention are described herein, variations and modifications thereof will occur to those skilled in the art. Therefore, it is intended that the appended claims shall be construed to include the preferred embodiments and all such variations and modifications in form and detail that fall within the spirit and scope of the invention.

I claim:

1. A memory cell comprising:
   a word line and a drain line;

a pair of load transistors having a shared emitter connected to said word line, a shared base connected to said drain line and a first collector and a second collector respectively;

a first storage transistor with a collector region connected to said first collector, a base region connected to said second collector, and an emitter region connected to said drain line, said collector region lying below said base and emitter regions;

a second storage transistor with a collector region connected to said second collector, a base region connected to said first collector and an emitter region connected to said drain line, said collector region lying below said base and emitter regions; and, transfer means for transferring data stored by said first and second storage transistors to a pair of bit lines.

2. The memory cell of claim 1 wherein said pair of load transistors are lateral transistors.

3. The memory storage cell of claim 1 wherein each said storage transistor's base region comprises polysilicon having a first dopant.

4. The memory cell of claim 3 wherein each said storage transistor's emitter region comprises polysilicon having a second dopant.

5. The memory cell of claim 4 wherein said first dopant is p type and said second dopant is n type.

6. The memory storage cell of claim 1 wherein said pair of load transistors are PNP transistors and said storage transistors are NPN transistors.

7. The memory cell of claim 1 wherein said transfer means comprises a pair of Schottky barrier diodes connected between the collector regions of said first and second storage transistors and said bit line pair.

8. The memory cell of claim 7 wherein said pair of load transistors are PNP transistors and said first and second storage transistors are NPN transistors.

9. The memory cell of claim 8 wherein the collector region of each said storage transistor is a cathode of one of said pair of Schottky barrier diodes 10. The memory cell of claim 9 wherein said pair of load transistors are lateral transistors.

11. The memory cell of claim 8 wherein each said storage transistor's base region comprises p doped polysilicon.

12. The memory cell of claim 11 wherein each said storage transistor's emitter region comprises n doped polysilicon.

13. The memory cell of claim 1 wherein said transfer means comprises a second emitter region in said first and second storage transistors whereby each said storage transistor is formed of a transistor pair with a common collector region, a common base region, and a pair of emitter regions.

14. The memory cell of claim 13 wherein said pair of load transistors are PNP transistors and said storage transistors are NPN transistors.

15. The memory cell of claim 14 wherein said pair of load transistors are lateral transistors.

16. The memory storage cell of claim 15 wherein each said common base region comprises p doped polysilicon.

17. The memory cell of claim 16 wherein each said storage transistor's pair of emitters comprises n doped polysilicon.

18. A memory cell comprising:
a word line and drain line;

a pair of lateral PNP load transistors having a shared emitter connected to said word line, a shared base connected to said drain line and a first collector and a second collector;

a first NPN storage transistor with a collector region formed by a first n-type well of diffusion and connected to said first collector, a base region formed by p-doped polysilicon and connected to said second collector, and an emitter region formed by n-doped polysilicon, said p-doped polysilicon lying on said collector region and said n-doped polysilicon lying on said base region;

a second NPN storage transistor with a collector region formed by a second n-type well of diffusion and connected to said second collector, a base region formed by p-doped polysilicon and connected to said first collector, and an emitter region formed by n-doped polysilicon, said p-doped polysilicon lying on said collector region and said n-doped polysilicon lying on said base region; and, transfer means for data stored by said storage transistors to a pair of bit lines.

19. The memory cell of claim 18 wherein said transfer means comprises a pair of Schottky barrier diodes formed in the collector of said first and second storage NPN transistors.

20. The memory cell of claim 18 wherein said transfer means comprises a second emitter region in said first and second NPN storage transistors, whereby each said storage transistor forms a transistor pair with a pair of emitter regions, its collector region forming a common collector, and its base forming a common base.

21. A semiconductor memory array comprising:
an array of memory cells having a plurality of rows and a plurality of columns;

word line driving means for driving a word line and a drain line on a selected said row responsive to a select signal;

writing means for storing data in one said memory cell in said selected row connected to a bit line pair on one selected said column;

reading means for sensing data stored in one said memory cell connected to said bit line pair on said selected column and for amplifying said sensed data; and each said memory cell connected to one said word line, one said drain line and to a bit line pair on one said column, each said memory cell comprising:

a pair of load transistors having a shared emitter connected to said cell's word line, a shared base connected to said cell's drain line and a first collector and a second collector, a first storage transistor with a collector region connected to said first collector-, a base region connected to said second collector, and an emitter region connected to said drain line, said collector region lying below said base and emitter regions, a second storage transistor with a collector region connected to said second collector, a base region connected to said first collector, and an emitter region connected to said drain line, said collector region lying below said base and emitter regions, and transfer means for transferring data stored by said storage transistors to said bit line pair.

22. The semiconductor memory array of claim 21 wherein each said memory cell's load transistors are lateral transistor.

23. The semiconductor memory array of claim 22 wherein each said memory cell's load transistors are PNP transistors and storage transistors are NPN transistors.

24. The semiconductor memory array of claim 23 wherein each said memory cell's transfer means comprise a pair of Schottky barrier diodes connected between the collector regions of said first and second storage transistors and said bit line pair.

25. The semiconductor memory array of claim 23 wherein each said memory cell's transfer means comprises a second emitter region in said first and second storage transistors, whereby each said storage transistor forms a transistor pair with a common collector region, a common base region, and a pair of emitter regions.

* * * * *